(12) United States Patent
Chen

(10) Patent No.: US 6,947,036 B2
(45) Date of Patent: Sep. 20, 2005

(54) LIQUID CRYSTAL DISPLAY WITH SPACE-SAVING CONVERSION MODULE

(75) Inventor: Kung-Fu Chen, Taipei (TW)

(73) Assignee: Via Technologies, Inc., Taipei (TW)

( * ) Notice: Subject to any disclaimer, the term of this patent is extended or adjusted under 35 U.S.C. 154(b) by 46 days.

(21) Appl. No.: 10/646,733

(22) Filed: Aug. 25, 2003

(65) Prior Publication Data

US 2004/0198076 A1 Oct. 7, 2004

(51) Int. Cl.⁷ .................... H01R 13/44; G09G 5/00
(52) U.S. Cl. ......................... 345/213; 439/137
(58) Field of Search .................. 345/213, 211, 345/212; 439/31, 137

(56) References Cited

U.S. PATENT DOCUMENTS 5,815,735 A    9/1998  Baker ................... 439/31
6,570,561 B1 * 5/2003  Boesch et al. ............ 345/213

FOREIGN PATENT DOCUMENTS

TW         4-43548       6/2001

* cited by examiner

*Primary Examiner*—Chandrika Prasad
(74) *Attorney, Agent, or Firm*—Rabin & Berdo, P.C.

(57) ABSTRACT

An electronic device with a conversion module for a liquid crystal display. The electronic device includes a motherboard, a liquid crystal display, and a converter board. The converter board is coupled to the motherboard and the liquid crystal display respectively, and converts a first signal from the motherboard to a second signal suitable for use by the liquid crystal display.

26 Claims, 2 Drawing Sheets

LIQUID CRYSTAL DISPLAY WITH SPACE-SAVING CONVERSION MODULE

BACKGROUND OF THE INVENTION

1. Field of the Invention

The invention relates to an electronic device and a conversion module for a liquid crystal display thereof; in particular, to an electronic device with a space-saving conversion module.

2. Description of the Related Art

In a conventional desktop computer, a CRT monitor is often used as a display thereof. The space required by the CRT monitor, however, is large and therefore may be inconvenient.

Recently, as liquid crystal displays have become less expensive, they are often used as displays for desktop computers, replacing CRT monitors.

The arrangement of the conventional desktop computer 10 is shown in FIG. 1. The desktop computer 10 includes a motherboard 11 and a liquid crystal display 12. The liquid crystal display 12 is connected to a connector 15 on the motherboard 11 via a flat cable 13 and a connector 14 so that the liquid crystal display 12 is coupled to the motherboard 11. It is noted that since the signal used in the liquid crystal display 12 is different from that in the motherboard 11, a conversion circuit 16 is usually disposed on the motherboard 11. Thus, the signal of the motherboard 11 can be converted into the signal adapted for the liquid crystal display 12.

Furthermore, the type of the conversion circuit and connector depends on the specification of the liquid crystal display. For example, the conversion circuit and the connectors may be LVDS (low voltage differential signaling) type or TMDS (transition minimized differential scaling) type. An LVDS type conversion device is disclosed in U.S. Pat. No. 5,815,735.

It is noted that notebook computers are not included in the consideration of this invention. Specifically, since the liquid crystal display is normally used as the display of the notebook computer, a chipset for converting the liquid crystal display is disposed on the motherboard of the notebook computer. Thus, in the notebook computer, the connectors and the conversion device as stated above are not required.

As stated above, for coupling to the liquid crystal display, the connector and the conversion circuit are additionally disposed on the motherboard. However, as motherboards become smaller, the arrangement of components on the motherboard becomes more difficult. Thus, it is important to minimize the size of the motherboard without reducing functionality.

SUMMARY OF THE INVENTION

In view of this, the invention provides an electronic device with a space-saving conversion module for a liquid crystal display.

Accordingly, the invention provides an electronic device including a motherboard, a liquid crystal display, and a converter board. The converter board is coupled to the motherboard and the liquid crystal display respectively, and converts a first signal from the motherboard to a second signal suitable for use by the liquid crystal display.

In a preferred embodiment, the electronic device further includes a first cable and a second cable. The first cable connects the motherboard and the converter board, and transmits the first signal to the converter board. The second cable connects the converter board and the liquid crystal display, and transmits the second signal to the liquid crystal display.

Furthermore, the electronic device includes a supporting member disposed between the motherboard and the converter board. The supporting member maintains a predetermined distance between the motherboard and the converter board.

In another preferred embodiment, the electronic device further includes a first connector and a second connector. The first connector is disposed on the motherboard. The second connector corresponds to the first connector, and is disposed on the converter board. The first signal is transmitted to the converter board by the first connector connecting to the second connector.

Furthermore, both the first connector and the second connector are LVDS type, and the converter board is LVDS type.

Furthermore, both the first and second connectors are TMDS type, and the converter board is TMDS type.

Furthermore, the electronic device includes a third cable connecting the first and second connectors.

In another preferred embodiment, the electronic device further includes a third connector and a fourth connector. The third connector is disposed on the liquid crystal display. The fourth connector corresponds to the third connector, and is disposed on the converter board. The second signal is transmitted to the liquid crystal display by the third connector connected to the fourth connector.

Furthermore, both the third and fourth connectors are LVDS type, and the converter board is LVDS type.

Furthermore, both the third and fourth connectors are TMDS type, and the converter board is TMDS type.

Furthermore, the electronic device includes a fourth cable connecting the third connector and the fourth connector.

It is understood that the motherboard may be Mini ITX (Information Technology Expanding) type developed by VIA Technologies, Inc, and the liquid crystal display may be a liquid crystal display module.

In this invention, a conversion module for a liquid crystal display and a motherboard are provided. The conversion module includes a converter board, a first connector, and a second connector. The converter board converts a first signal from the motherboard to a second signal suitable for use by the liquid crystal display. The first connector is disposed on the converter board and coupled to the motherboard. The second connector is disposed on the converter board and coupled to the liquid crystal display. The first signal is transmitted to the converter board and the second signal is transmitted to the liquid crystal display by the first and second connectors.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Embodiments

Embodiment 1

Figure 1:
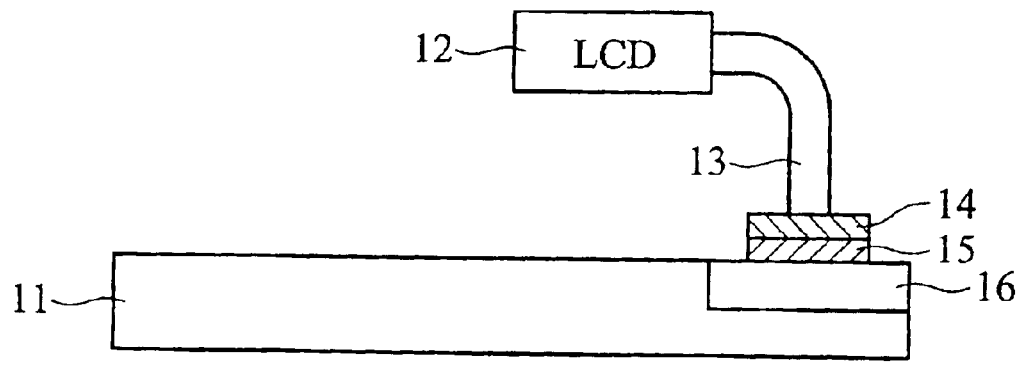
FIG. 1 is a schematic view of a conventional desktop computer.
Figure 2:
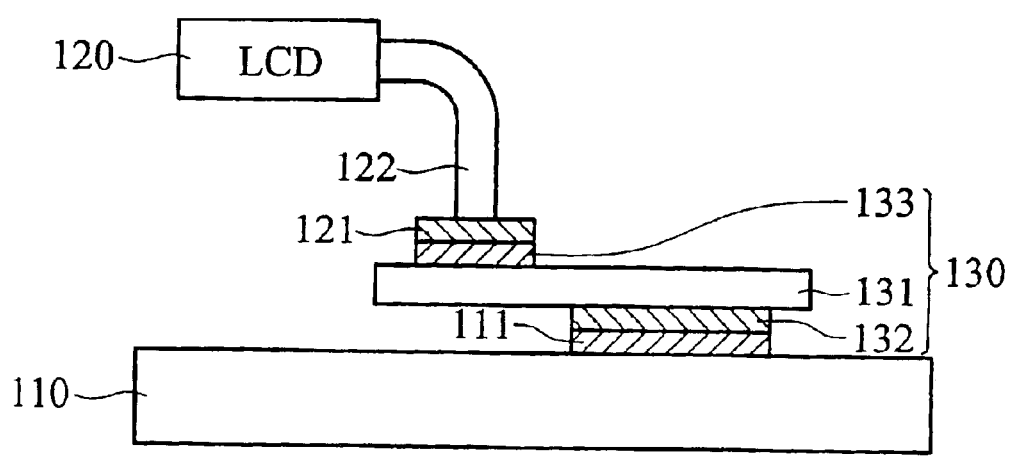
FIG. 2 is a schematic view of an electronic device as disclosed in a first embodiment of this invention.

FIG. 2 shows an electronic device 100 as disclosed in a first embodiment of this invention. In this embodiment, the electronic device 100 includes a motherboard 110, a liquid crystal display 120, and a conversion module 130 for the liquid crystal display 120.

A connector 111 is disposed on the motherboard 110. A cable 122 is disposed on the liquid crystal display 120, and a connector 121 is disposed on one end of the cable 122. Both connectors 111, 121 are coupled to the conversion module 130. It is understood that the liquid crystal display 120 may be a liquid crystal display module.

The conversion module 130 includes a converter board 130 and connectors 132, 133. The connector 132 is disposed on one surface of the converter board 131, and corresponds to the connector 111 on the motherboard 110 so as to be connected to the connector 111. By means of the connectors 132, 111, the conversion module 130 is coupled to the motherboard 110. The connector 133 is disposed on another surface of the converter board 131, and is located opposite to the connector 132. The connector 133 corresponds to the connector 121 so as to be connected to the connector 121. By means of the connectors 133, 121, the conversion module 130 is coupled to the liquid crystal display 120.

The converter board 131 is provided with a conversion circuit (not shown) thereon, and converts a signal from the motherboard 110 to a signal adapted to the liquid crystal display 120. That is, by means of the converting board 131 and the connectors 132, 133, the signal from the motherboard 110 can be converts to the signal adapted to the liquid crystal display 120 and transmits to the liquid crystal display 120.

As stated above, since the conversion circuit is disposed on the additional circuit board, the area occupied by the layout of the circuit on the motherboard can be reduced so as to minimize the size of the motherboard. As shown in FIG. 2, it may seem that the total height of the motherboard 110 may increase due to the conversion module 130; this, however, practical use is not accurate. Specifically, in a conventional motherboard, there are other components taller than the conversion module 130. Thus, even if the conversion module 130 is additionally disposed on the motherboard 110, it will not increase the total height of the motherboard 110. That is, components on the motherboard can be optimally arranged and therefore offer more flexibility.

It is understood that the types of connectors and the converter board depend on the specification of the liquid crystal display. For example, the connectors and the converter board may be LVDS type or TMDS type.

Furthermore, it is understood that since the design of this invention is suitable for compact motherboards, such as the Mini ITX type.

In addition, it is understood that the electronic device may be a desktop computer.

Embodiment 2

Figure 3:
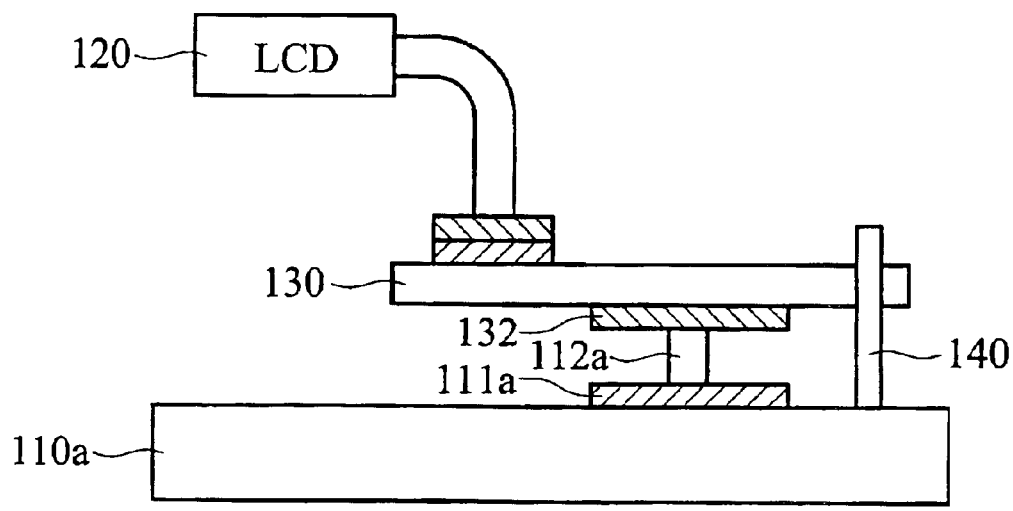
FIG. 3 is a schematic view of an electronic device as disclosed in a second embodiment of this invention.

FIG. 3 shows an electronic device 100a as disclosed in a second embodiment of this invention. In this embodiment, the electronic device 100a includes a motherboard 110a, a liquid crystal display 120, a conversion module 130, and a supporting member 140. It is understood that some components of this embodiment are similar to those in the first embodiment, and their description is omitted.

The motherboard 110a is provided with a connector 111a and a cable 112a. The cable 112a offers greater flexibility in the arrangement of the motherboard 110a and the conversion module 130.

However, since the connectors 132, 111a are not directly connected, the conversion module 130 cannot be fixed to the motherboard 110a. To maintain a predetermined distance between the motherboard 110a and the conversion module 130, the supporting member 140 is disposed between the motherboard 110a and the conversion module 130. It is understood that the supporting member 140 must be made of a highly rigid material so as to maintain the conversion module 130 at a predetermined position. For example, the supporting member 140 may be a copper post.

In this embodiment, the space occupied by the motherboard can be reduced, and the arrangement between the motherboard and the conversion module is more flexible due to the cable and the supporting member. It is understood that the total height of the combined motherboard and the conversion module should not be higher than that of the original motherboard, thus increasing available space around the motherboard.

Embodiment 3

Figure 4:
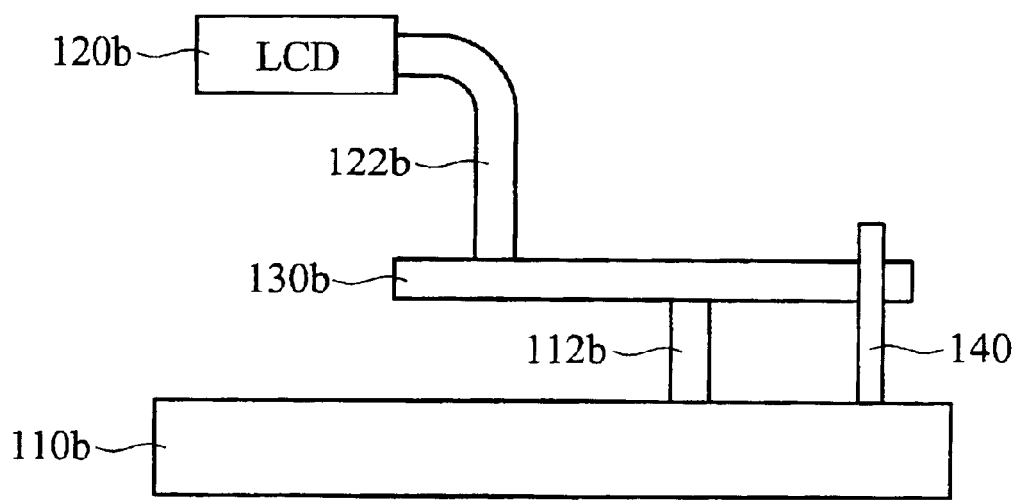
FIG. 4 is a schematic view of an electronic device as disclosed in a third embodiment of this invention.

FIG. 4 shows an electronic device 100b as disclosed in a third embodiment of this invention. In this embodiment, the electronic device 100b includes a motherboard 110b, a liquid crystal display 120b, a conversion module 130b, and a supporting member 140. It is understood that some components of this embodiment are similar to those in the first and second embodiments, and their description is omitted.

In this embodiment, cables 112b, 122b provide an interface, replacing the connectors in the first and second embodiments. Specifically, the motherboard 110b and the conversion module 130b communicate with each other via the cable 112b, and the liquid crystal display 120b and the conversion module 130b communicate with each other via the cable 122b.

Since the conversion module 130b cannot be fixed on the motherboard 110b, the supporting member 140 is disposed therebetween.

In this embodiment, the space occupied by the motherboard can be reduced, and the arrangement of the motherboard and the conversion module is more flexible due to the cable and the supporting member. It is understood that the total height of the combined motherboard and conversion module should not be higher than that of the original motherboard thus increasing available space around the motherboard.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art) Therefore, the scope of the appended claims should be accorded the broadest interpretation so as to encompass all such modifications and similar arrangements.

What is claimed is:

1. An electronic device comprising:
   a motherboard;
   a liquid crystal display;
   a converter board, coupled to the motherboard and the liquid crystal display respectively, for converting a first signal from the motherboard to a second signal suitable for use by the liquid crystal display; and
   a supporting member, disposed between the motherboard and the converter board, supporting the converter board and maintaining a predetermined distance between the motherboard and the converter board.

2. The electronic device as claimed in claim 1, further comprising:
   a first cable, connecting the motherboard and the converter board, for transmitting the first signal to the converter board; and
   a second cable, connecting the converter board and the liquid crystal display, for transmitting the second signal to the liquid crystal display.

3. The electronic device as claimed in claim 1, further comprising:
   a first connector disposed on the motherboard; and
   a second connector, corresponding to the first connector, disposed on the converter board, wherein the first signal is transmitted to the converter board by the first connector connected to the second connector.

4. The electronic device as claimed in claim 3, wherein both the first connector and the second connector are LVDS (low voltage differential signaling) type.

5. The electronic device as claimed in claim 4, wherein the converter board is LVDS type.

6. The electronic device as claimed in claim 3, wherein both the first connector and the second connector are TMDS (transition minimized differential scaling) type.

7. The electronic device as claimed in claim 6, wherein the converter board is TMDS type.

8. The electronic device as claimed in claim 3, further comprising a cable connecting the first connector and the second connector.

9. The electronic device as claimed in claim 1, further comprising:
   a third connector disposed on the liquid crystal display; and
   a fourth connector, corresponding to the third connector, disposed on the converter board, wherein the second signal is transmitted to the liquid crystal display by the third connector connected to the fourth connector.

10. The electronic device as claimed in claim 9, wherein both the third connector and the fourth connector are LVDS type.

11. The electronic device as claimed in claim 10, wherein the converter board is LVDS type.

12. The electronic device as claimed in claim 9, wherein both the third and fourth connectors are TMDS type.

13. The electronic device as claimed in claim 12, wherein the converter board is TMDS type.

14. The electronic device as claimed in claim 9, further comprising a cable connecting the third connector and the fourth connector.

15. The electronic device as claimed in claim 1, wherein the motherboard is mini ITX (Information Technology Expanding) type, and the liquid crystal display may be a liquid crystal display module type.

16. The electronic device as claimed in claim 1, wherein the liquid crystal display is a liquid crystal display module.

17. A conversion module for a liquid crystal display and a motherboard, comprising:
   a converter board for converting a first signal from the motherboard to a second signal suitable for use by the liquid crystal display;
   a first connector disposed on the converter board and coupled to the motherboard;
   a second connector disposed on the converter board and coupled to the liquid crystal display, wherein the first signal is transmitted to the converter board and the second signal is transmitted to the liquid crystal display by the first connector and the second connector; and
   a supporting member, disposed between the motherboard and the converter board and supporting the converter board for maintaining a predetermined distance between the motherboard and the converter board.

18. The conversion module as claimed in claim 17, wherein the first connector and the second connector are located at opposite sides of the converter board.

19. The conversion module as claimed in claim 18, wherein both the first connector and the second connector are LVDS type.

20. The conversion module as claimed in claim 19, wherein the converter board is LVDS type.

21. The conversion module as claimed in claim 17, wherein both the first connector and the second connector are TMDS type.

22. The conversion module as claimed in claim 21, wherein the converter board is TMDS type.

23. The conversion module as claimed in claim 17, further comprising:
   a first cable connecting the first connector and the motherboard.

24. The conversion module as claimed in claim 17, further comprising:
   a second cable connecting the second connector and the liquid crystal display.

25. An electronic device, comprising:
   a motherboard;
   a liquid crystal display;
   a converter board, coupled to the motherboard and the liquid crystal display respectively, for converting a first signal from the motherboard to a second signal suitable for use by the liquid crystal display; and
   a supporting member, mounted an the motherboard between the motherboard and the converter board, and supporting the converter board so as to maintain a predetermined distance between the motherboard and the converter board.

26. The electronic device as claimed in claim 25, further comprising:
   a first connector disposed on the converter board and coupled to the motherboard; and
   a second connector disposed on the converter board and coupled to the liquid crystal display, wherein the first signal is transmitted to the converter board and the second signal is transmitted to the liquid crystal display by the first connector and the second connector.

* * * * *